United States Patent [19]

Yomoda et al.

[11] Patent Number: 4,669,842
[45] Date of Patent: Jun. 2, 1987

[54] PROJECTION OPTICAL DEVICE

[75] Inventors: Minoru Yomoda, Kawasaki; Mitsugu Yamamura, Yokohama, both of Japan

[73] Assignee: Canon Kabushiki Kaisha, Tokyo, Japan

[21] Appl. No.: 677,517

[22] Filed: Dec. 3, 1984

[30] Foreign Application Priority Data

Dec. 8, 1983 [JP] Japan ............................. 58-230577
Dec. 8, 1983 [JP] Japan ............................. 58-230578
Dec. 12, 1983 [JP] Japan ............................. 58-23659

[51] Int. Cl.$^4$ .......................................... G03B 27/34
[52] U.S. Cl. ................................. 353/101; 353/122
[58] Field of Search ............... 355/44, 53, 55, 56, 355/30; 350/418, 419, 253; 353/100, 101, 122, 121

[56] References Cited

U.S. PATENT DOCUMENTS 4,236,790 12/1980 Smith ............................ 350/253
4,420,233 12/1983 Nomoto et al. .................. 353/122
4,503,335 3/1985 Takahashi ....................... 250/548

FOREIGN PATENT DOCUMENTS 146762 3/1985 European Pat. Off. .
1539581 1/1979 United Kingdom .
2117903A 10/1983 United Kingdom .

*Primary Examiner*—Harry N. Haroian
*Attorney, Agent, or Firm*—Fitzpatrick, Cella, Harper & Scinto

[57] ABSTRACT

An optical device projects a pattern of a first object on a second object through an optical system. Changes in the temperature of the optical system or changes in the ambient temperature of the optical system are detected and, on the basis of the detected temperature, any focus deviation or displacement of the optical system due to the temperature change is corrected. The correction of the focus deviation is achieved by controlling the temperature of the optical system or the position of the second object.

10 Claims, 4 Drawing Figures

PROJECTION OPTICAL DEVICE

BACKGROUND OF THE INVENTION

This invention relates to a projection optical device for projecting, through an optical system, a pattern formed on one object onto another object. More particularly, it relates to a projection optical device for use in the manufacture of semiconductor circuit devices.

In the semiconductor devices such as integrated circuits (IC), large scale integrated circuits (LSI) and very large scale integrated circuits (VLSI), circuit patterns have been radically miniaturized to achieve larger capacities, so that the minimum line width of the circuit patterns is required to be of the order of 1-2 microns. Various types of projection exposure apparatuses have been developed for the manufacture of these semiconductor devices, such as, for example, a reduction projection system, a one-to-one lens projection system or a mirror projection system. These projection exposure apparatuses are required to have a printing performance capable of printing a minute pattern of 1-2 microns line width and an alignment performance capable of achieving accurate alignment during various manufacturing steps, as well as stableness for minimizing the occurrence of wafer defects.

The printing performance of the projection exposure apparatus is determined by the effective F-number Fe of the projection optical system, for projecting the pattern of a mask onto a wafer, as well as the wavelength $\lambda$ of the printing beam, so that the depth of focus $\Delta Z$ can be defined by:

$$\Delta Z = \pm 2\lambda Fe^2$$

In currently available reduction projection exposure apparatuses each having a printing performance of 1-micron line, a printing beam of 0.436-micron wavelength is used and an optical system having an effective F-number Fe of the order of 1.4 is employed. The depth of focus is thus of the order of ±1.7 microns. Therefore, the projection exposure apparatus must have a focus adjusting mechanism for positively imaging the photomask pattern on the wafer surface, and various adjusting mechanisms have been proposed up to now.

These focus adjusting mechanisms can be classified into two: one is a through-the-lens (TTL) system in which the wafer position is detected through a projection optical system and, on the basis of the detection results, the wafer is moved to the best imaging position; and another is a constant-distance system in which the wafer position is adjusted so that a constant distance is always maintained between the projection optical system and the wafer. The first-mentioned system requires a complicated optical system and causes various limitations to the design of the projection optical system. For this reason, most of the projection exposure apparatuses employ the focus adjusting mechanisms of the second-mentioned type.

In the already proposed focus adjusting mechanisms of the constant-distance type, the wafer position is detected by using air-nozzles, non-contact electric micrometers, optical sensors or the like. Each of these systems has a position detecting accuracy of the order of ±0.3 micron and ensures in co-operation with the adjusting mechanism the positioning of the wafer at a constant distance, relative to the projection optical system, satisfying the depth of focus.

The above-mentioned constant-distance system however involves inconveniences such as follows.

According to the constant-distance system, the wafer is always positioned at a constant distance from the projection optical system. Thus, in order that the wafer is always located at the best or optimum imaging position, the best imaging position of the projection optical system must be unchangeable.

When, however, the projection optical system is irradiated by the printing beam to effect printing of the wafer, the projection optical system absorbs a portion of the printing beam, as is known in the art, so that the optical performance changes due to the heat whereby the best imaging position is displaced.

In order to correct such changes, caused by the heat, in the optical performance of the projection optical system, it has been proposed that, with respect to the projection optical system, the focus error which is changeable with the lapse of the printing time is preparatively measured and one of the positions of the mask, the projection optical system and the wafer is corrected in accordance with the printing time. However, in addition to the heat caused by the printing beam, the projection optical system is affected by various heats, such as an ambient temperature, the heat which is generated within the interior of the projection exposure apparatus containing the projection optical system. Therefore, the correction of the changes in the optical performance is insufficient.

On the other hand, in order to prevent the effect of temperature with respect to the projection exposure apparatus, it has been proposed to use the projection exposure apparatus within a thermo-regulated room or to blow a thermo-regulated air over the entire projection exposure apparatus. Alternatively, it has been proposed to use a box-like member for housing the major part of the internal members of the projection exposure apparatus and to feed a fluid having a constant temperature into the box-like member.

However, each of these systems requires a bulky temperature control device, causing increase in the cost of manufacture. Moreover, it is difficult to completely prevent all the effects, relative to the projection optical system, of the heat caused by the light beam passing through the projection optical system, of the heat caused by the heat source contained within the interior of the projection exposure apparatus including the projection optical system, and of the changes in the ambient temperature or the like. It is therefore difficult to maintain the best or optimum optical performance.

SUMMARY OF THE INVENTION

In view of the foregoing, it is a primary object of the present invention to provide an optical device capable of preventing degradation of the optical performance of the projection optical system due to the displacement of the focus position caused by the changes in the ambient temperature of the projection optical system.

Another object of the present invention is to provide an optical device capable of correcting, with a simple structure, the displacement of the focus position of the projection optical system.

A further object of the present invention is to provide an optical device capable of changing the resolving power, magnification, distortion and/or focus position of the projection optical system as desired.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
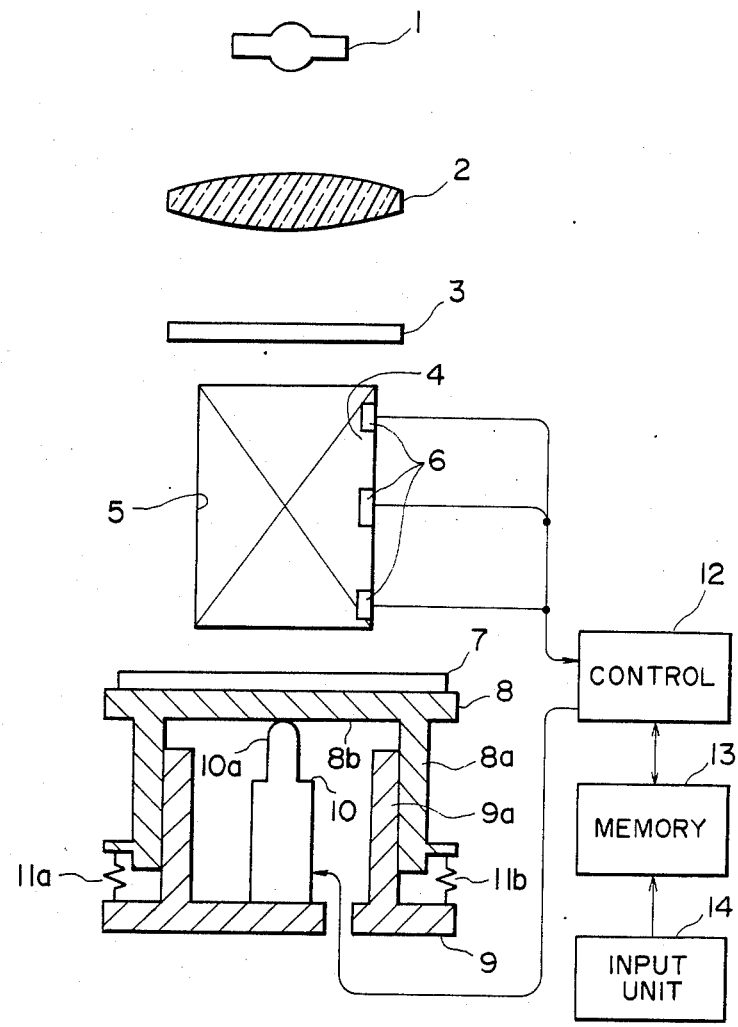
FIG. 1 is a cross-sectional view showing an optical device according to one embodiment of the present invention.

Referring first to FIG. 1 schematically showing a projection type semiconductor exposure apparatus according to one embodiment of the present invention, the light beam emitted from a light source 1 is condensed by a condensor lens 2 and illuminates a mask 3 having an integrated circuit pattern, so that the pattern of the mask 3 is projected through a projection lens 4 onto a wafer 7.

The projection lens 4 comprises a plurality of lenses or reflecting mirrors (not shown) which are supported by a cylindrical supporting member 5. On the internal wall of the supporting member 5, one or more temperature detectors 6 are provided. These temperature detectors 6 are disposed at different positions and are connected to a common control circuit 12 which will be described later.

A piezo-electric device 10 is secured on a base member 9 of a wafer chuck 8. Actually, the piezo-electric device 10 comprises a stack of a number of piezo-electric element chips, the stack extending in the direction of the optical axis of the projection lens 4. In order that the tip 10a of the piezo-electric device 10 abuts against the lower surface 8b of the wafer chuck 8, the wafer chuck 8 is provided with a guide 8a which is fitted around a guide 9a formed on the wafer chuck base 9, for slidable movement through a plurality of tension coil springs 11a and 11b in the direction of the optical axis of the projection lens 4, i.e., upwardly and downwardly as viewed in FIG. 1.

The exposure apparatus further includes a memory unit 13 connected to the control circuit 12. The amount of focus displacement or deviation of the projection lens 4 corresponding to the temperature change is preparatively determined on the basis of measurement and is input into the memory unit 13 from an input unit 14, so that the control unit 12 produces a voltage corresponding to the amount of focus displacement and applies it to the piezo-electric device 10.

With this arrangement and when the pattern of the mask 3 is to be projected on the wafer 7, the temperature of the projection lens 4 is directly detected by the temperature detectors 6 and the temperature distribution or average temperature of the projection lens 4 is input into the control unit 12. The control unit 12 reads out the amount of focus displacement of the projection lens 4 corresponding to the detected temperature and applies to the piezo-electric device 10 a voltage corresponding to the thus read amount of focus displacement. Responsive to the applied voltage, the piezo-electric device 10 expands or contracts to move the wafer chuck 8 in the direction of the optical axis of the projection lens 4, whereby the wafer 7 is maintained at the best imaging position of the projection lens 4.

While the FIG. 1 embodiment uses one piezo-electric device 10 moving the wafer 7 as the means for correcting the focus correspondingly to the detected temperature, the focus correction can be made by any of known means.

As an alternative for moving the wafer 7, a coarse positioning of the wafer 7 may be first effected by a motor or a lever and a fine positioning may be then effected by a piezo-electric device such as 10. Further, if three piezo-electric devices are provided at different positions and the focus position corresponding to the temperature is memorized with respect to each of the positions of the three piezo-electric devices, the adjustment is easy even in a case where the plane of focus is inclined.

Further, the focus correction can be made by moving the mask 3 in a similar manner as described above. As the means for moving the mask 3 or wafer 7, a pneumatic actuator providing an accurate up-and-down movement by using an air pressure may be used in place of the piezo-electric device.

Still further, it is possible to change the focal point position of the projection lens 4, rather than moving the mask 3 or wafer 4. For example, a transparent container containing therein a transparent liquid material is provided at a lower position on the optical axis of the projection lens and another transparent container is immersed in the liquid. The thickness of the liquid material is changed by relatively moving the container in the direction of the optical axis of the projection lens 4, so that the focal point position of the projection lens is changed owing to the amount of refraction by the liquid material.

Figure 2:
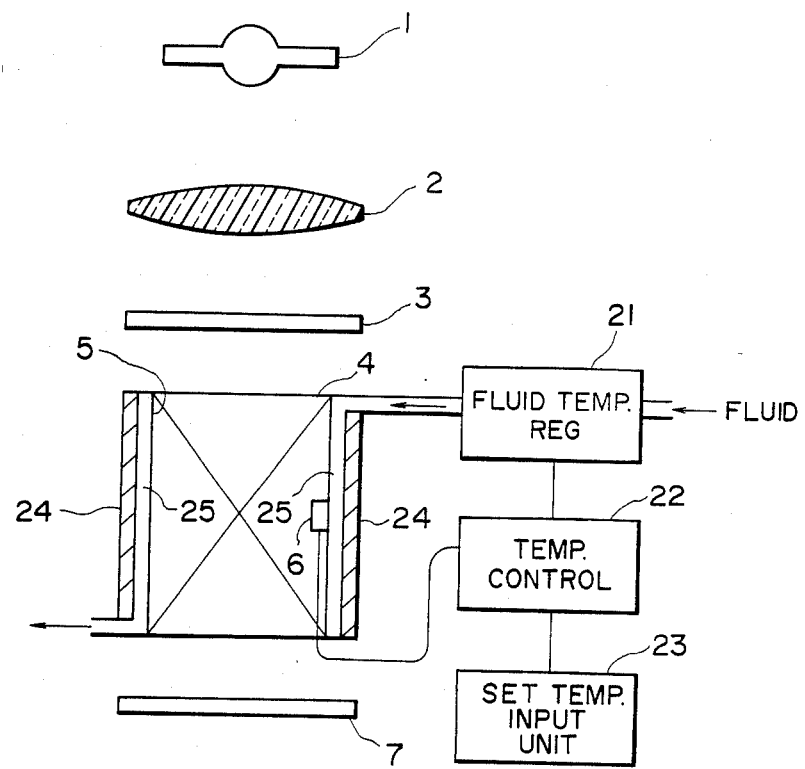
FIG. 2 is a cross-sectional view showing an optical device according to another embodiment of the present invention.

FIG. 2 schematically shows a projection exposure apparatus according to another embodiment of the present invention. In FIG. 2, the elements corresponding to those of FIG. 1 embodiment are denoted by the same reference numerals. Similarly to the FIG. 1 embodiment, the projection exposure apparatus of FIG. 2 includes a light source 1, a condensor lens 2, a projection lens 4, a supporting member 5 and a temperature detector 6 which have corresponding functions as of those in FIG. 1 embodiment. The FIG. 2 embodiment differs from the FIG. 1 embodiment in the following points:

The temperature detector 6 is connected to a temperature control circuit 22 which will be described later. The supporting member 5 is encircled by a cylindrical member 24 so that a duct portion 25 for passing therethrough a gas or liquid is defined between the supporting member 5 and the cylindrical member 24. The supporting member 5 is made of a material of high thermal conductivity such as aluminum or copper while the cylindrical member 24 is made of a heat-insulating material having a lower thermal conductivity and a lower heat expansion coefficient, such as ceramic. The internal wall of the supporting member 5 may be coated with a material of a higher thermal conductivity.

The duct 25 is connected to a fluid source (not shown) through a fluid temperature regulator 21 which in turn is connected to a temperature control circuit 22. The temperature control circuit 22 is connected to the temperature detector 6 and a set temperature input unit 23.

With this arrangement and when the pattern of the mask 3 is to be projected onto the wafer 7 through the projection lens 4, the temperature within the projection lens 4 is detected by the temperature detector 6. The temperature control circuit 22 compares the detected temperature within the projection lens 4 with the desired temperature which has been input into the set temperature input unit 23, and controls the fluid temperature regulator 21 in accordance with the temperature difference. The fluid temperature regulator 21 thus controls the temperature of the fluid. The thermoregulated fluid passes through the duct 25 so that the temperature of the interior of the projection lens 4 is regulated at a value which is the same as the temperature previously set in the set temperature input unit 23.

While in this embodiment the duct 25 is arranged so that the fluid flows along the outer wall of the supporting member 5 for the projection lens 4, a similar duct or pipe member may be provided on the internal wall of the supporting member 5. In the FIG. 2 embodiment, the correction of focus position is achieved by controlling the temperature of the projection lens 4 so that the focus position of the projection lens 4 coincides with the wafer 7 surface, as compared with the FIG. 1 embodiment in which the wafer 7 is moved in the direction of the optical axis of the projection lens 4 to compensate for the focus displacement or deviation caused by the temperature change in the projection lens 4.

Figures 3, 4:
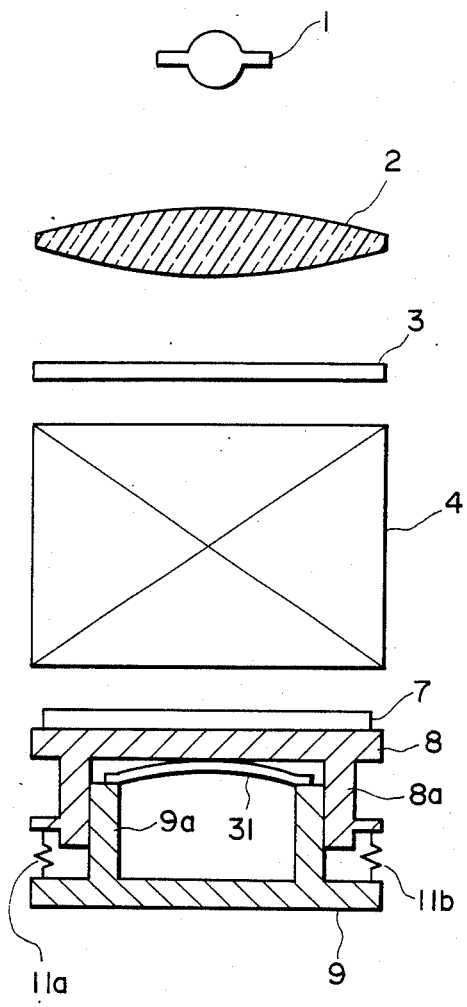
FIG. 3 is a cross-sectional view showing an optical device according to a further embodiment of the present invention.
FIG. 4 is a cross-sectional view showing a modified form of the FIG. 3 embodiment.

FIG. 3 schematically shows a projection exposure apparatus according to a further embodiment of the present invention. In FIG. 3 embodiment, the elements having similar functions as of those of the FIG. 1 embodiment are denoted by the same reference numerals. In FIG. 3 embodiment, a wafer chuck base 9 is provided with a guide portion 9a which extends upwardly as viewed in FIG. 3 and has an upper surface of an appropriate shape. A wafer chuck 8 has on its lower surface a guide portion 8a which extends downwardly as viewed in FIG. 3 and is adapted to fit around the guide portion 9a of the wafer chuck base 9. Disposed on the guide portion 9a of the wafer chuck base 9 is an upwardly convexed bimetallic element 31 on which the wafer chuck 8 rests. The guide portions 8a and 9a are connected to each other for relative slidable movement. Between these guide portions 8a and 9a, there are provided a plurality of tension coil springs 11a and 11b so that a tension force is applied between the guide portions 8a and 9a.

The materials and the sizes of the bimetallic element 31 are selected to ensure that in accordance with the amount of focus displacement or deviation of the projection lens 4 due to the temperature change near the projection lens 4, the wafer chuck 8 is moved upwardly or downwardly through the same amount. Therefore, in operation of the exposure apparatus, that is when the pattern of the mask 3 is printed on the wafer 7, the bimetallic element 31 is continuously deformed in accordance with the ambient temperature of the projection lens 4 to continuously move the wafer chuck 8 upwardly or downwardly. As the result, the wafer 7 is always maintained at the best imaging position of the projection lens 4.

While in this embodiment the bimetallic element 31 is arranged so that the amount of deformation relative to the temperature, i.e., the amount of upward or downward movement becomes equal to the amount of focus deviation corresponding to the temperature of the projection lens 4, this is not necessary if a lever or the like is used. In such case, the amount of movement of the bimetallic member may be proportional to the amount of focus deviation.

Moreover, the FIG. 3 embodiment may be modified such as illustrated in FIG. 4 in which the bimetallic element 31 is inverted so that the direction of movement relative to the changes in the ambient temperature is inverted. In place of moving the wafer 7, the mask 3 may be moved by a similar mechanism.

The present invention is not limited to the semiconductor exposure apparatus as in the disclosed embodiments, and is applicable to exposure apparatuses such as a hologram manufacturing apparatus, a copying apparatus or the like. Particularly, the FIG. 3 embodiment is applicable to a film urging plate in a camera.

In accordance with the present invention as has hitherto been described, any focus deviation of the projection optical system due to the temperature changes caused by the heat generated by various sources such as a light source, driving movement or the like within the apparatus, or the temperature changes caused by the changes in the ambient temperature can be corrected, so that the limitation to the location of the projection exposure apparatus with respect to the temperature can be loosened.

Also according to the present invention, a desired temperature can be set in the projection optical system. As the result, the fine adjustment of the optical performance becomes possible. Further, in a projection exposure apparatus of fixed-focal-point system, the focus position would not be affected by the ambient temperature, according to the present invention. This eliminates the necessity of a complicated focus adjusting mechanism.

Moreover, the present invention assures correction of the focus position relative to the changes in the ambient temperature with a compact and simple structure and with a reduced cost.

While the invention has been described with reference to the structures disclosed herein, it is not confined to the details set forth and this application is intended to cover such modifications or changes as may come within the purposes of the improvements or the scope of the following claims.

What is claimed is:

1. An optical device comprising:
   projecting means for projecting a pattern of a first object on a second object; and
   correcting means for correcting the relation between the focus position of said projecting means and the second object, the relation being changeable depending on the temperature, wherein said correcting means detects the ambient temperature of said projecting means and corrects the relation in accordance with the detected temperature, and wherein said correcting means is adapted to supply a thermo-regulated fluid along an element supporting said projecting means.

2. A device according to claim 1, wherein said correcting means has setting means for setting the temperature of the fluid such that the focus position of said projecting means coincides with the surface of the second object.

3. A device according to claim 2, wherein said correcting means has detecting means for detecting the temperature of said projecting means, said detecting means being disposed on the projecting means.

4. A device according to claim 3, wherein said correcting means controls the temperature of the fluid on the basis of the difference between the temperature detected by said detecting means and the temperature set by said setting means.

5. A device according to claim 4, wherein said element for supporting said projecting means has on its outer periphery a cover member for defining a passage for the fluid.

6. A device according to claim 5, wherein said cover member is made of a material having a lower thermal conductivity and a lower thermal expansion coefficient.

7. A device according to claim 6, wherein said cover member is made of a ceramic material.

8. A device according to claim 7, wherein said detecting means is disposed on said supporting element.

9. A device according to claim 8, wherein said supporting element is made of a material having a higher thermal conductivity.

10. A device according to claim 1, wherein said projecting means has a lens system.

* * * * *